United States Patent
Ceran

(10) Patent No.: US 8,449,940 B2
(45) Date of Patent: May 28, 2013

(54) DEPOSITION OF HIGH-PURITY SILICON VIA HIGH-SURFACE AREA GAS-SOLID INTERFACES AND RECOVERY VIA LIQUID PHASE

(76) Inventor: Kagan Ceran, Carlsbad, CA (US)

( * ) Notice: Subject to any disclaimer, the term of this patent is extended or adjusted under 35 U.S.C. 154(b) by 850 days.

(21) Appl. No.: 12/597,151

(22) PCT Filed: Apr. 25, 2008

(86) PCT No.: PCT/US2008/061651
§ 371 (c)(1),
(2), (4) Date: Oct. 22, 2009

(87) PCT Pub. No.: WO2008/134568
PCT Pub. Date: Nov. 6, 2008

(65) Prior Publication Data
US 2010/0086466 A1    Apr. 8, 2010

Related U.S. Application Data

(60) Provisional application No. 60/913,997, filed on Apr. 25, 2007.

(51) Int. Cl.
*C01B 33/035* (2006.01)

(52) U.S. Cl.
USPC .................................... 427/248.1; 423/349

(58) Field of Classification Search
USPC .................................... 427/248.1; 423/349
See application file for complete search history.

(56) References Cited

U.S. PATENT DOCUMENTS

| | | | |
|---|---|---|---|
| 2,893,850 A | 7/1959 | Von Bichowsky | |
| 2,904,404 A | 9/1959 | Ellis, Jr. | |
| 3,865,647 A | 2/1975 | Reuschel | |
| 4,176,166 A | 11/1979 | Carman | |
| 4,242,307 A | 12/1980 | Fally | |
| 4,265,859 A | 5/1981 | Jewett | |
| 4,272,488 A | 6/1981 | Carman | |
| 4,590,024 A | 5/1986 | Lesk | |
| 4,710,260 A | 12/1987 | Witter et al. | |
| 4,981,102 A | 1/1991 | Gautreaux | |
| 5,006,317 A | 4/1991 | Sanjurjo | |
| 5,820,649 A | 10/1998 | Ogure et al. | |
| 6,007,869 A | 12/1999 | Schreieder et al. | |
| 6,395,249 B1 | 5/2002 | Kondo | |
| 6,861,144 B2 | 3/2005 | Wakamatsu et al. | |
| 7,413,718 B2 * | 8/2008 | Nakamura et al. | 422/198 |
| 7,553,467 B2 * | 6/2009 | Wakamatsu et al. | 423/349 |
| 2005/0201908 A1 | 9/2005 | Nakamura | |

FOREIGN PATENT DOCUMENTS

WO    03106338 A1    12/2003

* cited by examiner

*Primary Examiner* — Jie Yang
(74) *Attorney, Agent, or Firm* — Venable, Campillo, Logan & Meaney PC

(57) ABSTRACT

Solid silicon is deposited onto electrically heated deposition plates by the reduction reaction of gaseous trichlorosilane and hydrogen which are mixed and pumped across the surfaces of the plates. The plates can have a number of high-surface area geometries such as concentric cylinders, spirals, or repeating S-shapes. Once the desired amount of silicon has been deposited, the deposition plates are heated to above the melting point of silicon causing the deposited silicon to slide off the plates in the form of a crust due to gravitational force. The plates are left coated with a thin film of liquid silicon which contains any impurities leached from the plates. This film is melted off separately from the main silicon crust to avoid contamination of the latter and the plates are then ready for the next deposition cycle.

5 Claims, 8 Drawing Sheets

Deposition plate geometries (top view)

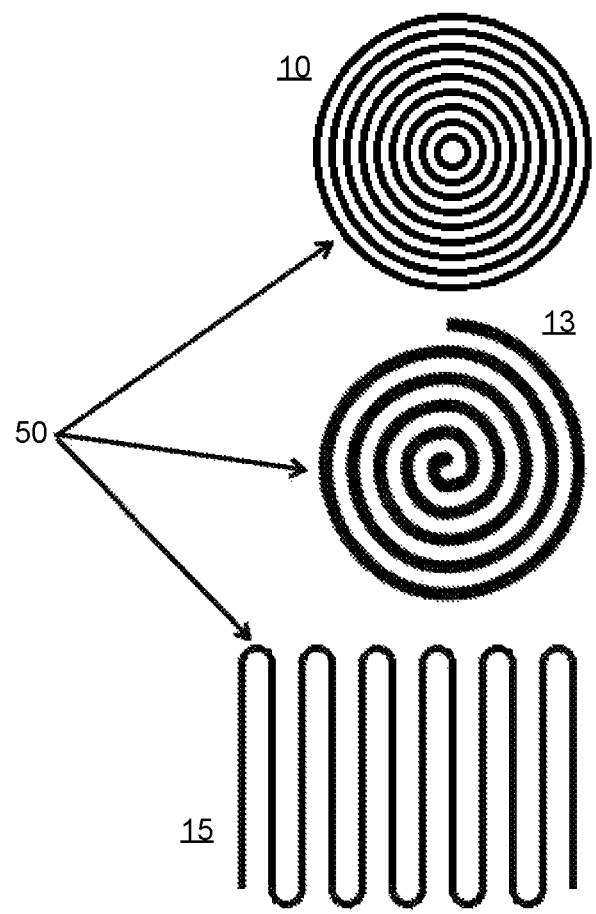
Fig. 1: Deposition plate geometries (top view)

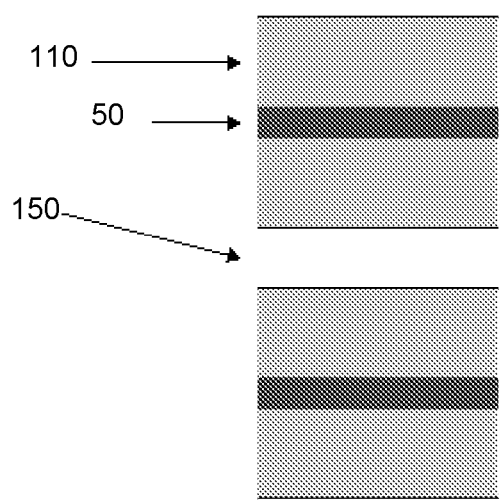
Fig. 2: Deposition plate surface details

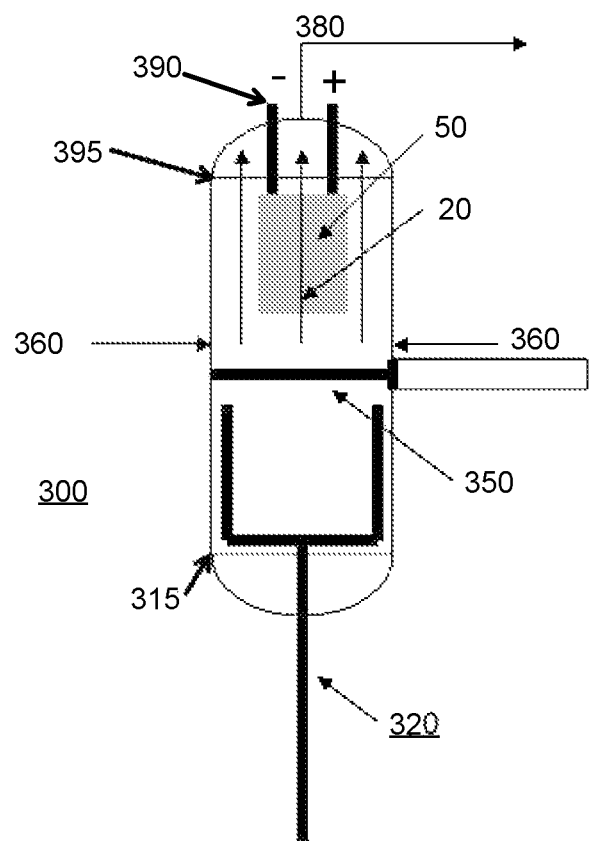
Fig. 3: Deposition reactor during deposition step

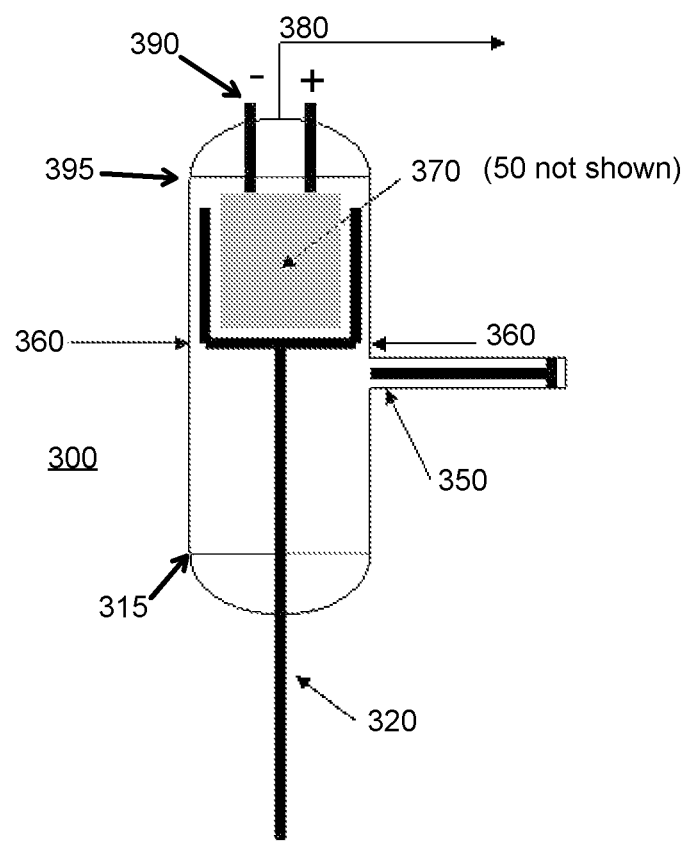
Fig. 4: Deposition reactor during silicon recovery step

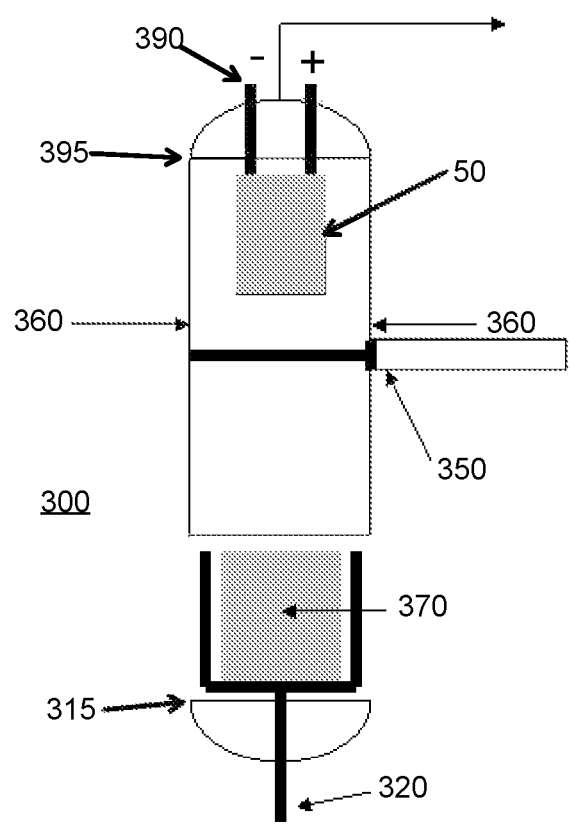
Fig. 5: Deposition reactor during silicon removal step

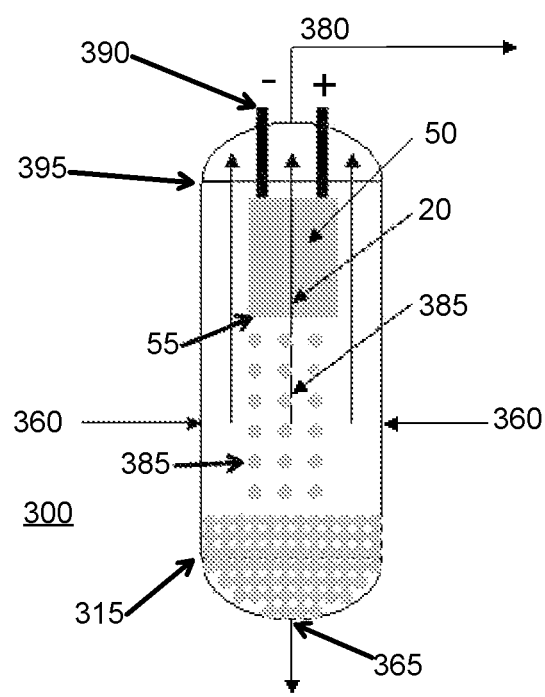
Fig. 6: Deposition-drip reactor with gaseous silane feed

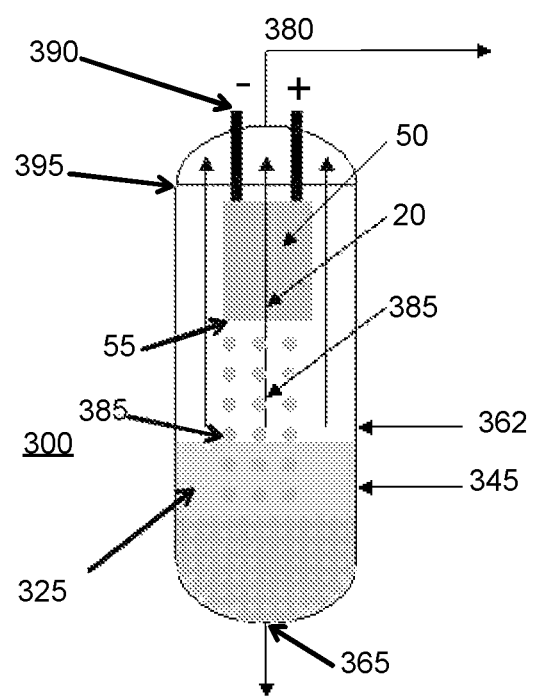
Fig. 7: Deposition-drip reactor with liquid silane feed

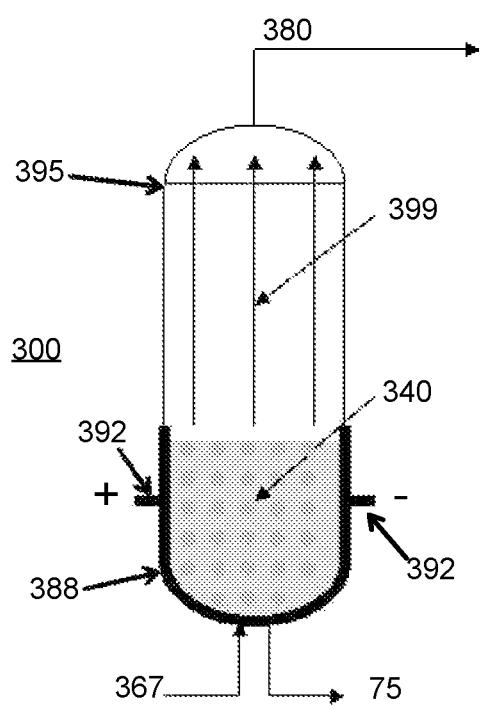
Fig. 8: Deposition-bubble reactor

DEPOSITION OF HIGH-PURITY SILICON VIA HIGH-SURFACE AREA GAS-SOLID INTERFACES AND RECOVERY VIA LIQUID PHASE

The present application claims benefit of U.S. provisional patent application No. 60/913,997 filed Apr. 25, 2007 which is hereby incorporated herein in its entirety.

BACKGROUND TO THE INVENTION

The majority of the world's supply of high purity electronics grade or solar grade silicon is produced using the so-called "trichlorosilane-Siemens" route, wherein a mixture of trichlorosilane and hydrogen gas are placed in contact with electrically heated feed rods of silicon in a pressurized reactor vessel know as a "Siemens reactor." The diameter of these rods increases over time as silicon is deposited onto their surfaces from the gas mixture as a result of the reduction reaction caused by the high temperature of the rods. The extremely high purity requirements of the silicon make it necessary to deposit then new silicon onto feed rods of silicon, as deposition onto any other materials typically causes contamination of the silicon from those materials. Nevertheless this process is inefficient for a number of reasons including:
1. The rods have a relatively low surface area which is one of the key determinants of the deposition reaction rate,
2. A large amount of electricity is required to keep an increasingly large mass of silicon with a still relatively low ratio of surface area heated to the correct temperature for an extended period of time,
3. It is very labor-intensive to remove the rods. The entire top section of the reactor, which is shaped like a bell, has to be unbolted and lifted to access the rods. The rods must then be removed, and transported to a separate location for cutting and/or crushing and packaging, or melting into ingots. This excessive amount of handling results in high down-times for the reactors during each batch cycle and can also introduce impurities into the silicon. And,
4. New feed rods must be manufactured and reinstalled into the reactors for the cycle to recommence.

Information relevant to the present invention can be found in U.S. Pat. Nos. 2,893,850, 4,242,307, 4,265,859, 4,272,488, 4,590,024, 4,710,260, 4,981,102, 5,006,317, 6,395,249, 6,861,144, 4,176,166, 2,904,404, 2,943,918, 3,016,291, 3,071,444, 3,168,422, 3,733,387, 3,865,647, 4,054,641, 4,710,260, 2,962,363, 4,125,592, 4,127,630, 4,242,697, 4,246,249, 4,282,184, 4,314,525, 4,353,875, 4,547,258 and US Patent Publication No. 2005-0201908 and non-US Patents: WO03106338A1 (PCT), 1292640 (DE), 2002-176653 (JP laid open pub. no.) and 37-17454 (JP); each of the foregoing United States Patents and non-United States Patents are hereby incorporated herein by reference. Each one of these referenced items, however, suffers from one or more of the limitations cited above.

SUMMARY

The present invention overcomes both the limitations of low deposition surface area per reactor and long and laborious rod changeover procedures associated with existing so-called Siemens reactors while still meeting the necessary purity requirements for the recovered silicon. Low surface area is overcome by using deposition plates manufactured from materials that can easily be fabricated into high-surface area geometries such as silicon carbide, silicon nitride, tungsten, and composites thereof. These materials also maintain their structural integrity at temperatures above the melting point of silicon allowing the deposited silicon to be melted off the plates, thus significantly reducing the time required to remove the silicon from the reactors and prepare the reactors for the next deposition cycle.

Therefore the main financial advantages of the present invention can be summarized as:
1. Significant reduction in electricity usage per quantity of silicon produced,
2. Significant reduction in labor per quantity of silicon produced,
3. Significant reduction in plant equipment costs per quantity of silicon produced; fewer hydrogen deposition reactors are required to produce the same amount of silicon, and
4. In another preferred embodiment, where the silicon crust which has slid off the deposition plates is melted completely in the bottom of the deposition reactor and is cast into a multicrystalline ingot inside the deposition reactor or is pumped to a Czokralski crystal puller, elimination of the need, and costs thereof, to remove, process, package, ship, unpack, load, and re-melt the silicon in another location.

BRIEF DESCRIPTION OF THE DRAWINGS

FIG. 1 shows the top views of several deposition plate geometries that can be used to increased surface area in given volume of space.

FIG. 2 is a closeup of the plate surface, showing the plate material itself, the deposited layer of silicon, and the space between the deposited layers of silicon where the gas mixtures flows.

FIG. 3 shows a deposition reactor during the silicon deposition step.

FIG. 4 shows a deposition reactor during the silicon recovery step.

FIG. 5 shows a deposition reactor during the silicon removal step.

DESCRIPTION

Deposition Plates

As defined in this patent application, the term "deposition plates" refers to the surfaces upon which the silicon is deposited; therefore, as an example, a flat electrical conducting plate may create at least two deposition plates as discussed below (i.e. deposition surfaces) having a gas flow area between them. However, nothing precludes the use of more than one plate to form deposition plates; for example, using two vertical flat electrical conducting plates by placing them next to one another to form a gas flow channel. The electrical conducing plates need to have the following characteristics:
1. Good electrical conductivity
2. Good structural strength against repeated and extended exposure to temperatures above the melting point of silicon, and ability to support the mass of silicon to be deposited
3. Relative ease of fabrication
4. Compatibility with silicon (i.e., plate surface material should minimize contamination of the silicon)

As an example, preferred materials meeting these requirements include tungsten, silicon carbide, silicon nitride, graphite, and alloys and composites thereof.

In a preferred embodiment, the deposition plates can be made by forming flat electrical conducting plates with typical thicknesses of several millimeters and typical widths of 1 to 2 meters, of the appropriate materials previously cited, into the shapes shown in FIG. 1. Preferably, any deposition plate geometries can be used to increased surface area in given volume of space. Most preferably deposition plate geometries are chosen to achieve the maximum surface area in given volume of space. While any geometry may be chosen; preferred examples of these geometries are 10 concentric cylinders, spiral plates 13, and S-shaped 18. In the preferred embodiment of this invention, the deposition plates are at least two vertically oriented deposition plates (i.e. two vertically oriented deposition surfaces).

In the preferred embodiment of this invention, FIG. 2 shows a cross-section of the details of the deposit plate including the deposited silicon 110, the electrically heated plate 50, and the gas flow area 150.

Deposition Reactor

The deposition reactor is largely similar to a conventional so-called Siemens reactor with the following exceptions:
1. Deposition occurs on electrically heated deposition plates rather than on electrically heated pure silicon rods. The plates can be heated either by direct application of electric current or by induction heating.
2. There is a pressure plate that separates the reactor into two sections during the deposition step. During this step, the upper section of the reactor is pressurized with an incoming gas mixture of hydrogen and trichlorosilane while the lower section containing a hydraulically mounted silicon recovery crucible is idle and at atmospheric pressure.
3. During the silicon recovery step, the pressure plate is opened and the hydraulically mounted recovery crucible is raised to the deposition plates. Upon further heating of the plates to above the melting temperature of silicon, the deposited silicon slides off or melts off into the crucible.
4. During the silicon recovery step, the hydraulically mounted recovery crucible is lowered to the bottom of the reactor where it attaches itself. The bottom of the reactor is then unlocked and they hydraulic piston lowers both the reactor bottom and the crucible out of the reactor so that the silicon in the crucible can be removed.

FIG. 3 shows one preferred embodiment of a deposition reactor as configured during the deposition step including the reactor vessel 300, a recovery crucible 320 in the retracted state, a pressure plate 350 in a closed position, gas inlets 360 for the deposition gas mixture, the deposition plates 50 connected to electric heating leads 390 for heating the deposition plates, and vent 380 wherein the deposition gas 20 flows and reacts across the deposition plates 50 to deposit high purity silicon and the reacted gas is removed through the vent 380 and the electric heating leads 390 heat the deposition plate 50 to achieve the temperature for silicon deposition. Preferably, the recovery crucible is movable and more preferably is movable using a hydraulic system. Similarly, the reactor vessel 300 may be opened to remove the contents, and preferably either the top 395 or the bottom 315 or both may be opened and closed. Preferably the gas mixture is hydrogen-silane mixture.

FIG. 4 shows a preferred embodiment of the deposition reactor during the high purity silicon recover step including the reactor vessel 300, a recovery crucible 320 in the transfer state, a pressure plate 350 in an open position, gas inlets 360 wherein the gas is turned off, the deposition plates 50 having deposited silicon thereon and connected to electric heating leads 390 for heating the deposition plates wherein the deposition plates 50 (not shown as coated with 370) are heated to achieve melt-off temperatures so that the high purity silicon 370 transfers to the recovery crucible. During the melting process, it is possible that impurities from the deposition plate may leach into the thin liquid layer of silicon between the plate and the silicon crust to be recovered. This layer essentially acts as a barrier between the plate and the silicon crust. Once the crust is recovered in the recovery crucible, the thin liquid layer of silicon can be removed from the plate by continued melting and disposal or the plate itself can be changed out and replaced with a clean plate. The original plate can be cleaned separately and returned to service for the next batch.

1. Deposition occurs on electrically heated deposition plates rather than on electrically heated pure silicon rods,
2. The mixture of hydrogen, trichlorosilane and/or silicon tetrachloride is introduced in the lower section of the reactor allowing an upward-flowing stream of gas to form.
3. This gas stream cools the silicon droplets which are dripping from the deposition plates and they become solid beads which accumulate in the bottom of the reactor.
4. The accumulated solid beads of silicon are periodically removed from the reactor by shutting off the gas flow and opening a discharge chute.
5. Trichlorisilane and/or silicon tetrachloride can also be introduced into the deposition-drip reactor in liquid form. This liquid provides additional cooling for the liquid droplets of silicon dripping into it, allowing them to solidify into beads and settle to the bottom of the reactor. The liquid that is vaporized as a result of contact with the liquid silicon droplets is mixed with hydrogen being pumped into the reactor above the liquid surface. This gas mixture then contacts the deposition plates which are heated to above the melting point of silicon, thus causing the formation of the liquid silicon droplets in the first place.

The high purity silicon removal step from the deposition reactor is shown in FIG. 5 including the reactor vessel 300, a recovery crucible 320 in the retracted state, a pressure plate 350 in a closed position, gas inlets 360 for the deposition gas mixture are closed, the deposition plates 50 connected to electric heating leads 390 for heating the deposition plates are off wherein the bottom 315 is opened so that the recovery crucible 320 with the high purity silicon 370 may be removed.

The invention claimed is:
1. A method for producing high-purity silicon comprising the steps of:
   a. Creating one or more deposition plates each with one or more deposition surfaces which have a high surface area, which can be rapidly, homogenously, and simultaneously heated, and which will not contaminate high-purity silicon,
   b. Having a geometry for said deposition plates such that the ratio of average deposition surface area to deposition reactor internal volume is increased,
   c. Placing said deposition plates in a deposition reactor,
   d. Flowing a deposition gas mixture into the deposition reactor to deposit silicon onto the deposition surfaces wherein the deposition gas mixture flows through the spaces between the deposition plates and the deposition surfaces are heated to a temperature that optimizes the deposition reaction of the deposition gas mixture, e. After the desired amount of silicon has been deposited, further heating the deposition plates to above the melting point of silicon so as to create only a thin layer of liquefied silicon between the plate and the remaining solid crust of deposited silicon, f. Sliding off the solid crust of deposited silicon from the deposition plates by applying a force such as gravitational force.

2. The method for producing high-purity silicon in claim 1 wherein the deposition gas mixture includes one or more members of the group consisting of trichlorosilane, silicon tetrachloride, and other silanes.

3. The method for producing high-purity silicon in claim 1 wherein the deposition plates are made from materials which will not contaminate high-purity silicon and which have the appropriate structural, electrical, and thermal characteristics, such as tungsten, silicon carbide, silicon nitride, graphite, and alloys and composites of these materials.

4. The method of producing high purity silicon in claim 1 wherein the solid crust of deposited silicon is supported by a container such as a crucible and does not slide off the deposition plates once they have been heated to above the melting temperature of silicon.

5. The method for producing high-purity silicon in claim 4 wherein the deposition plates completely melt the solid crust of deposited silicon and the container with the resulting liquid silicon is pulled away from the deposition plates in a controlled manner such that the liquid silicon directionally solidifies into an ingot of multicrystalline silicon.

* * * * *